United States Patent [19]

Azuma et al.

[11] Patent Number: 4,495,218
[45] Date of Patent: Jan. 22, 1985

[54] PROCESS FOR FORMING THIN FILM

[75] Inventors: Kazufumi Azuma, Hiratsuka; Mitsuo Nakatani, Yokohama; Kazuo Nate, Machida; Masaaki Okunaka; Hitoshi Yokono, both of Fujisawa, all of Japan

[73] Assignee: Hitachi, Ltd., Tokyo, Japan

[21] Appl. No.: 534,686

[22] Filed: Sep. 22, 1983

[30] Foreign Application Priority Data

Sep. 29, 1982 [JP] Japan ............... 57-168463

[51] Int. Cl.³ .............................. C23C 17/00
[52] U.S. Cl. ................... 427/53.1; 427/54.1; 427/86; 427/93; 427/94
[58] Field of Search ............ 427/53.1, 54.1, 86, 427/93, 94

[56] References Cited

U.S. PATENT DOCUMENTS

| 3,200,018 | 8/1965 | Grossman | 427/82 |
| 3,271,180 | 9/1966 | White | 427/99 |
| 4,348,428 | 9/1982 | Rockley et al. | 427/86 |
| 4,363,828 | 12/1982 | Brodsky et al. | 427/86 |

Primary Examiner—John H. Newsome
Attorney, Agent, or Firm—Antonelli, Terry & Wands

[57] ABSTRACT

A thin film of a-Si, $SiO_2$ or $Si_3N_4$ can be formed on a substrate using a starting material gas containing at least a polysilane of the formula $Si_nH_{2n+2}$ (n=2, 3 or 4) by a chemical vapor deposition method with irradiation with light with high film forming rate at lower temperatures.

8 Claims, 1 Drawing Figure

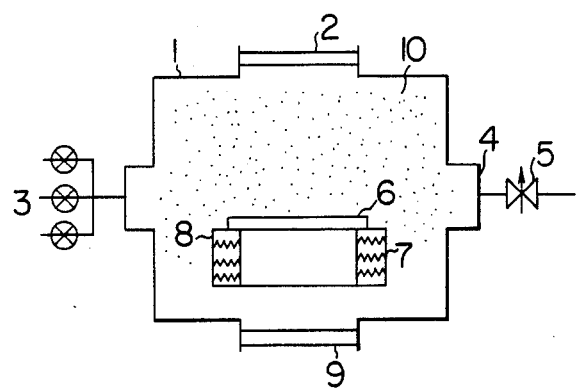

PROCESS FOR FORMING THIN FILM

This invention relates to a process for forming a thin film, particularly a thin film containing silicon, on a substrate.

Heretofore, films of $SiO_2$, $Si_3N_4$ and a-Si have been formed by pyrolysis of a gas mixture containing $SiH_4$ at high temperatures. But in semiconductor production processes, it has been strongly desired that the processes are conducted at lower temperatures. In order to respond to such a requirement, plasma CVD (chemical vapor deposition) methods applying discharge plasma have been studied as a possible method for forming a film at low temperatures [R. C. G. Swann et al., J. Electrochem. Soc., 114, 713 (1967); R. J. Joyce et al., Thin Solid Films, 1, 481 (1967); Y. Kuwano, Japan J. Appl. Phys., 7, 88 (1968); R. Greht et al., J. Electrochem. Soc., 119 (No. 9), 1249 (1972); A. K. Sirha et al., ibid., 125 (No. 4), 601 (1978); M. J. Helix et al., Thin Solid Films, 55, 143 (1978); and W. Kem et al., J. Vac. Sci. Tech., 14 (No. 5), 1082 (1977)]. According to the plasma CVD methods, the film forming can be conducted at low temperatures, but there are many disadvantages in that high energy is required, it is difficult to control the reaction stoichiometrically, it is difficult not to produce by-products, there arise damages on the film surface due to high energy, and the like.

Recently, studies on photo CVD methods in which ultraviolet light, laser, or the like is used as energy source have been developed rapidly. According to the photo CVD methods, it is possible to form a thin film at low temperatures by applying photo-excitation and photolysis of starting material gases. In addition, there is another advantage in the stoichiometrical reaction control is easy. For example, Sarkozy of Hughes Aircraft Co., proposes a process for forming a $SiO_2$ film using $SiH_4$ and $O_2$ as starting material gases and Hg vapor as photosensitizer with irradiation of ultraviolet light at a temperature of 100° to 200° C. (Technical Digest of 1981 Symposium on VLSI Technology, pp. 68 September 1981). Peters et al of Hughes Aircraft Co., propose a process for forming a $SiO_2$ or $Si_3N_4$ film using $SiH_4$ and $N_2O$ or $SiH_4$ and $NH_3$ as starting material gases and Hg vapor as photosensitizer with irradiation of ultraviolet light at a low temperature of 100° C. or lower (e.g. U.S. Pat. No. 4,181,751). These processes are suitable for deposition on a large area, but the deposition rate is so slow that these processes cannot be applied to practical uses.

There is also proposed a process for forming an a—Si film from $SiH_4$ in which the Si—H bond is excited by $CO_2$ laser (Book of Lectures at 8th Divisional Meeting on Crystal Technology, the Society of Applied Physics, United Kingdom, page 10, 1981). According to this process, there are defects in that when the $SiH_4$ concentration is high, the light is absorbed by $SiH_4$; the reaction also takes place in a space in a reaction chamber; when the $SiH_4$ concentration is low, the deposition rate is lessened.

It is an object of this invention to provide a process for forming a thin film of a—Si, $SiO_2$ or $Si_3N_4$ at low temperatures with high speed.

This invention provides a process for forming a thin film of a—Si, $SiO_2$ or $Si_3N_4$ on a substrate in a chemical vapor deposition apparatus using light as energy source, characterized by using as a starting material gas at least one polysilane of the formula:

$$Si_nH_{2n+2}$$

wherein n is an integer of 2, 3 or 4.

The attached drawing is a schematic diagram showing a CVD apparatus.

In this invention, as silane starting material, the compound of the formula: $Si_nH_{2n+2}$ (n=2, 3 or 4) should be used. Examples of such a compound are $Si_2H_6$, $Si_3H_8$, $Si_4H_{10}$, etc. These compounds can be used alone or as a mixture thereof.

When $Si_2H_6$, $Si_3H_8$, $Si_4H_{10}$ or the like is used as silane starting material, the photoreaction efficiency is improved and a fast deposition rate can be obtained. Reasons for such advantages of this invention seem to be as follows. $SiH_4$ which has been used conventionally has absorption only in a vacuum ultraviolet region. But in the case of a polysilane $Si_nH_{2n+2}$ (n=2, 3 or 4), absorption shifts to a longer wavelength side with an increase of the number of Si—Si bonds and absorbs ultraviolet light more effectively. Further, since the Si—Si bond is easily cut, the deposition rate increases resultantly compared with the case of using $SiH_4$. (Ultraviolet light absorption of $SiH_4$ is at 150 nm or less, while in the case of polysilanes ultraviolet light absorption of $Si_2H_6$ is about 190 nm, that of $Si_3H_8$ is about 215 nm, and that of $Si_4H_{10}$ is about 240 nm, these wavelengths being absorption end wavelengths at the longer wavelength side.)

This invention is explained in detail referring to the attached drawing showing a CVD apparatus (or reactor) in which numeral 1 denotes a reaction vessel, 2 a quartz window, 3 a gas inlet, 4 an exhaust vent, 5 a variable valve, 6 a substrate, 7 a sheath heater, 8 a sample stand, 9 a light taking-out window, and 10 starting material gases. The reaction vessel 1 is usually made of stainless steel or quartz.

The substrate 6 in the reaction vessel is irradiated with light passing through the quartz window 2.

As a light source, there can be used ultraviolet lamps such as a xenon lamp, a xenon-mercury lamp, a high pressure mercury lamp, a low pressure mercury lamp, etc., ultraviolet lasers, the second higher harmonics of Ar ion laser, excimer laser of $F_2$, ArF, KrF, XeF, XeCl, or $N_2$, etc.

As the substrate 6, there can be used a silicon wafer, glass such as quartz glass, soda glass, NESA glass, indium tin oxide (ITO) glass, etc., a metal such as aluminum, stainless steel, etc., a metal film such as a stainless steel film, etc., and a resin film such as a polyimide film, etc.

The pressure in the reaction vessel changes depending on purposes and is usually 0.1 to 100 Torr, preferably 0.1 to 1 Torr. If the pressure is too low, the film forming rate becomes slow, while if the pressure is too high, film forming properties become worse.

The temperature of the substrate is preferably 20° to 400° C., more preferably 150° to 300° C.

It is possible to use Hg vapor as photosensitizer. When a mercury lamp is used as light source, the efficiency of Hg vapor excitation by Hg light of 254 nm is remarkable. When a light of near 200 nm is used as light source, it is effective to use a gas which can easily be excited by the light of near 200 nm. When Hg vapor is used, a small vessel containing mercury is placed in the reaction vessel and the vapor pressure of mercury is applied.

A polysilane gas and other reactive gases, if necessary, and the like are introduced into the reaction vessel 1 through the gas inlet 3.

In the case of forming an a—Si film, only a polysilane gas is used. An inert gas such as He, Ar, $N_2$, or the like may be used as a diluent gas.

In the case of forming a $SiO_2$ film, a polysilane gas and a reactive gas such as $O_2$, air, $N_2O$ or the like are used. The inert gas as mentioned above can also be used together.

In the case of forming a $Si_3N_4$ film, a polysilan gas and a reactive gas such as $NH_3$ are used. The inert gas as mentioned above can also be used together.

The film thickness is usually several hundred angstroms to several thousands angstroms and is regurated depending on purposes.

The film forming rate is at least 20 to 30 Å/min or more in the case of forming a—Si film by photo CVD according to this invention and is larger than that (about 10 Å/min) of using $SiH_4$ as starting material. Since the film forming rate of a—Si film is the latest among the film forming rates of a—Si film, $SiO_2$ film and $Si_3N_4$ film, the film forming rates according to this invention naturally becomes larger than the abovementioned values in the case of forming $SiO_2$ film and $Si_3N_4$ film.

The film formed adheres to a substrate strongly and has the same good physical and chemical properties as those obtained by the thermal CVD, plasma CVD methods and also by the photo CVD method using $SiH_4$ as starting material.

The a—Si film can be used in solar cells, photo sensors, and the like. The $SiO_2$ and $Si_3N_4$ films can be used as protective film and insulating film such as semiconductor interlayer insulating film, element separating insulating film, etc. The $SiO_2$ and $Si_3N_4$ films are particularly suitable, when step coverage is required, since the process of this invention is better in the step coverage compared with a vapor deposition method and a sputtering method.

This invention is illustrated in detail by way of the following Examples.

EXAMPLE 1

A CVD apparatus as shown in the attached drawing was used. The reaction vessel 1 made of stainless steel and having an inner diameter of 167 mm was used. A 3-inch silicon wafer was fixed on the sample stand 8 as substrate 6. After removing the air in the reaction vessel to produce vacuum of $10^{-5}$ Torr, a helium gas containing 10% by volume of $Si_2H_6$ gas (b.p. $-15°$ C., synthesized by the process described in J. Chem. Phys., 26, 1107 (1957) by G. W. Bethke and M. K. Wilson, or Z. anorg, u. allgem. Chem., 300, 210 (1959) by H. Kriegsmann) at a flow rate of 10 SCCM (standard cubic centimeter) and a $N_2O$ gas at a flow rate of 10 SCCM were introduced into the reaction vessel through the gas inlet 3. At the same time, ultraviolet light obtained from a low-pressure mercury lamp (254 nm, 10 mW/cm$^2$) was irradiated from the quartz window 2. The gas pressure at this time was about 1 Torr. A small vessel containing mercury was placed in the reaction vessel and heated at about 30° to 40° C. The heating temperature of substrate was about 50° C. As a result, a $SiO_2$ film was formed on the substrate at a film forming rate of about 700 Å/min. The deviation of film thickness was within ±5%.

When $SiH_4$ gas was used in place of $Si_2H_6$ for comparison, the film forming rate was about 400 Å/min.

When the formed film was subjected to etching by using a hydrofluoric acid series etching solution, the etching speed was the same as the case of etching the $SiO_2$ film formed by a photo CVD method using $SiH_4$ gas as a starting material.

EXAMPLE 2

The process of Example 1 was repeated except for using $NH_3$ and $Si_2H_6$ as starting materials at a flow rate ratio $NH_3/Si_2H_6$ of about 10 to 20. The substrate was heated upto about 250° C. A $Si_3N_4$ film was formed at a film forming rate of about 150 Å/min, which was about 3.2 times as fast as the case of using $SiH_4$ and $NH_3$ under similar conditions. The resulting $Si_3N_4$ film was confirmed by infrared spectrum. The chemical structure of the $Si_3N_4$ film was the same as that obtained by a plasma CVD method.

EXAMPLE 3

The process of Example 1 was repeated except for using as starting material gases a helium gas containing 10% by volume of $Si_2H_6$ at a flow rate of 10 SCCM and excimer laser (KrF, 249 nm) as light source. The film forming rate (deposition speed) was 1000 Å/min (repetition rate, 2.5 Hz; 1 pulse, 16 nsec).

When $SiH_4$ gas was used in place of $Si_2H_6$, the film forming rate was 700 Å/min.

The formed film was a film of amorphous silicon. Contamination by mercury was not detected by secondary ion mass spectroscopy (SIMS).

EXAMPLES 4 TO 9

Reaction gases listed in Table 1 were flowed under the conditions shown in Table 1 and irradiated with ultraviolet light. The results are shown in Table 1.

TABLE 1

| Example No. | Starting materials (Flow rate: ml/min) | | Light source | Substrate temperature (°C.) | Film and its forming rate (Å/min) |
|---|---|---|---|---|---|
| 4 | $Si_3H_8$ (b.p. 53° C.) | 10% wt | Excimer laser (KrF) 249 nm | up to 100 | a-Si 1100 |
|   | He (10 ml/min) | 90% wt | | | |
| 5 | $Si_4H_{10}$ (b.p. 80° C.) | 10% wt | Excimer laser (KrF) 249 nm | up to 100 | a-Si 1200 |
|   | He (10 ml/min) | 90% wt | | | |
| 6 | $Si_2H_6$ | 10% wt | Excimer laser (KrF) 249 nm | up to 250 | a-Si 1350 |
|   | He (10 ml/min) | 90% wt | | | |
| 7 | $Si_3H_8$ | 10% wt | Excimer laser | up to 100 | a-Si 1200 |
|   | He | 90% wt | | | |

TABLE 1-continued

| Example No. | Starting materials (Flow rate: ml/min) | | | Light source | Substrate temperature (°C.) | Film and its forming rate (Å/min) |
|---|---|---|---|---|---|---|
| | (20 ml/min) | | | (KrCl) 222 nm | | |
| 8 | $Si_2H_6$ | 10% wt | (10 ml/min) | Low pressure mercury lamp 10 mW/cm² | up to 250 | $SiO_2$ 1000 |
| | He | 90% wt | | | | |
| | $N_2O$ | | (30 ml/min) | 254 nm | | |
| 9 | $Si_3H_8$ | 10% wt | (10 ml/min) | Low pressure mercury lamp 10 mW/cm² | up to 150 | $SiO_2$ 1100 |
| | He | 90% wt | | | | |
| | $N_2O$ | | (30 ml/min) | 254 nm | | |

Note
Total gas pressure was 0.1 to 5 Torr in every case.

What is claimed is:

1. A process for forming a thin film by a chemical vapor deposition method, which comprises:
supplying a starting material gas containing at least one polysilane of the formula:

$$Si_nH_{2n+2}$$

wherein n is an integer of 2, 3 or 4, into a reaction vessel of a chemical vapor deposition apparatus containing a substrate heated to a temperature of from 20° C. to 300° C.; the pressure in said reaction vessel being from 0.1 to 100 torr,
irradiating the starting material gas with ultraviolet light, and
forming a thin film of silicon on the substrate.

2. A process according to claim 1, wherein the starting material gas is $Si_2H_6$, $Si_3H_8$ or $Si_4H_{10}$.

3. A process according to claim 1, wherein the substrate is silicon wafer, a glass or metal plate, or a metal or resin film.

4. A process according to claim 1, wherein the ultraviolet light is obtained from an ultraviolet lamp or ultraviolet laser.

5. A process for forming a thin film by a chemical vapor deposition method, which comprises:
supplying starting material gas comprising a mixture of at least one polysilane of the formula:

$$Si_nH_{2n+2}$$

wherein n is 2, 3 or 4 and a reactive gas selected from the group consisting of $O_2$, air and $N_2O$ into a reactive vessel of a chemical vapor deposition apparatus containing a substrate heated to a temperature of from 20° C. to 300° C., the pressure in said reaction vessel being from 0.1 to 100 torr,
irradiating the starting material gas with ultraviolet light and
forming a thin film of $SiO_2$ on the substrate.

6. A process according to claim 5, wherein the substrate is silicon wafer, a glass or metal plate, or a metal or resin film.

7. A process for forming a thin film by a chemical vapor deposition method, which comprises:
supplying a starting material gas containing a mixture of at least one polysilane of the formula:

$$Si_nH_{2n+2}$$

wherein n is an integer of 2, 3 or 4, and $NH_3$ into a reaction vessel of a chemical vapor deposition apparatus containing a substrate heated to a temperature of from 20° C. to 300° C., the pressure in said reaction vessel being from 0.1 to 100 torr,
irradiating the starting material gas with ultraviolet light, and
forming a thin film of $Si_3N_4$ on the substrate.

8. A process according to claim 7, wherein the substrate is silicon wafer, a glass or metal place, or a metal or resin film.

* * * * *